United States Patent [19]

Allen

[11] 4,447,804

[45] May 8, 1984

[54] SERIAL TO PARALLEL DATA CONVERSION INTERFACE CIRCUIT

[75] Inventor: John H. Allen, Orlando, Fla.

[73] Assignee: The United States of America as represented by the Secretary of the Navy, Washington, D.C.

[21] Appl. No.: 275,564

[22] Filed: Jun. 22, 1981

[51] Int. Cl.³ .......................................... H03K 13/258
[52] U.S. Cl. ............................................. 340/347 DD
[58] Field of Search ................ 340/347 DD; 364/200, 364/900; 377/75; 360/39

[56] References Cited

U.S. PATENT DOCUMENTS

| | | | |
|---|---|---|---|
| 3,267,460 | 7/1963 | Merrell | 340/347 DD X |
| 3,310,626 | 3/1967 | Cassidy | 340/347 DD X |
| 3,395,400 | 7/1968 | De Witt | 340/347 DD X |
| 3,416,133 | 12/1968 | Hunkins | 340/347 DD X |

Primary Examiner—C. D. Miller

Attorney, Agent, or Firm—Robert F. Beers; Robert W. Adams; David S. Kalmbaugh

[57] ABSTRACT

A serial to parallel data conversion interface circuit is disclosed for converting a serial word supplied by a head tracker to a parallel word so as to allow for the processing of the parallel word by a microprocessor. The head tracker supplies to the interface circuit a data ready pulse signal. The interface circuit, in response to the data ready pulse signal, supplies a data acknowledge pulse signal and a clock signal to the head tracker so as to allow the serial word from the head tracker to be transferred to the interface circuit, which then converts the serial word to a parallel word. An enable pulse signal supplied to the interface circuit effects the transfer of the parallel word from the interface circuit to the microprocessor. A reset pulse from the microprocessor then resets the interface circuit so as to allow for the transfer of another serial word from the head tracker.

13 Claims, 3 Drawing Figures

SERIAL TO PARALLEL DATA CONVERSION INTERFACE CIRCUIT

BACKGROUND OF THE INVENTION

1. Field of the Invention

This invention relates generally to data conversion. In particular, this invention relates to an electronics circuit for the conversion of serial data into words of parallel bits suitable for assimilation by a computer.

2. Description of the Prior Art

Data in a serial format must first be converted into a parallel format before it can be applied to the input terminal of a computer. This conversion is generally accomplished by the use of a serial to parallel converter circuit. Such circuits of the prior art generally contain a storage register which stores a predetermined number of serial data bits therein. The aforementioned data bits are then read out in parallel and applied to the input terminal of a computer.

One such serial to parallel data converter of the prior art is disclosed in U.S. Pat. No. 3,395,400 to Russell G. DeWitt and John P. Forde. This serial to parallel data converter, in turn, includes a shift register for storing therein a predetermined number of serial data bits. Subsequent data of the input signal is then diverted to a store for a predetermined time during which the shift register is cleared. After the predetermined time, the diverted data bits are read into the shift register at a much higher rate than the bit rate of the input signal, and they are followed by the immediately following bits of the input signal.

A second serial to parallel data converter of the prior art is disclosed in U.S. Pat. No. 3,267,460 to F. M. Merrell and E. A. Herrera. This serial to parallel data converter, in turn, includes parallel mode means for producing an output word in the parallel mode, or for receiving a word in the parallel mode, or both; and serial mode means for producing an output word in the serial mode, or for receiving a word in the serial mode, or both. In addition, the aforementioned converter includes therein a first shift register connected between the parallel mode means and the serial mode means, and having a storage capacity of L bits, and a second shift register connected in parallel with the first shift register and having a storage capacity of B bits where B is a smaller number than L.

While the aforementioned devices of the prior art perform satisfactorily for their intended purpose, that of data conversion, these devices of the prior art ordinarily leave something to be desired, especially from the standpoints of complexity in design, data transmission speed, and cost effectiveness. In addition, the aforesaid devices of the prior art do not operate in the same manner as the subject invention, and contain a combination of elements that is somewhat different from that of the present invention.

SUMMARY OF THE INVENTION

The present invention overcomes some of the disadvantages of the prior art, including those mentioned, in that it comprises a relatively simple serial to parallel data converter for converting a serial output word into a parallel format.

Included in the subject invention are first, second, and third input terminals adapted to receive, respectively, a data ready pulse signal, a data request pulse signal, and a plurality of data words, each data word of which has a plurality of data bits.

A pair of shift registers then receives and stores therein for a first predetermined time period in response to a clock signal the aforesaid data words. The first data word, in turn, is stored in the aforementioned shift registers in response to the data ready pulse signal, while subsequent data words are stored in the aforesaid shift registers in response to the data request pulse signal. Gating means will next provide a latch pulse signal so as to effect the transfer of the data words stored within the aforesaid shift registers to a pair of storage registers. A microprocessor will then provide an enable pulse signal to the storage registers, thereby effecting the transfer of the data words from the storage registers to the microprocessor.

DESCRIPTION OF THE PREFERRED EMBODIMENT

Figure 1:
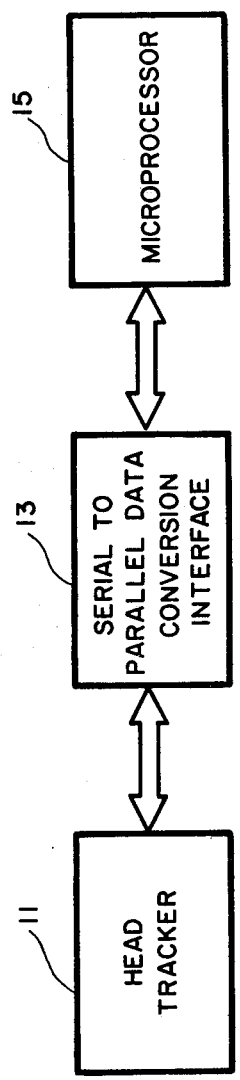
FIG. 1 is a block diagram of a typical situation in which the subject invention may be utilized.

The preferred embodiment of the subject invention will now be discussed in some detail in conjunction with all of the figures of the drawing, wherein like parts are designated by like reference numerals insofar as it is possible and practical to do so.

Referring first to FIG. 1, there is shown a head tracker 11, the input-output terminal of which is connected to the first input-output terminal of a serial-to-parallel data conversion interface circuit 13, with the second input-output terminal thereof connected to the input-output terminal of a microprocessor 15. Interface circuit 13, in turn, converts the serial data provided by head tracker 11 to a parallel data format so as to allow microprocessor 15 to process the parallel data, as will be discussed more fully below.

Figure 2:
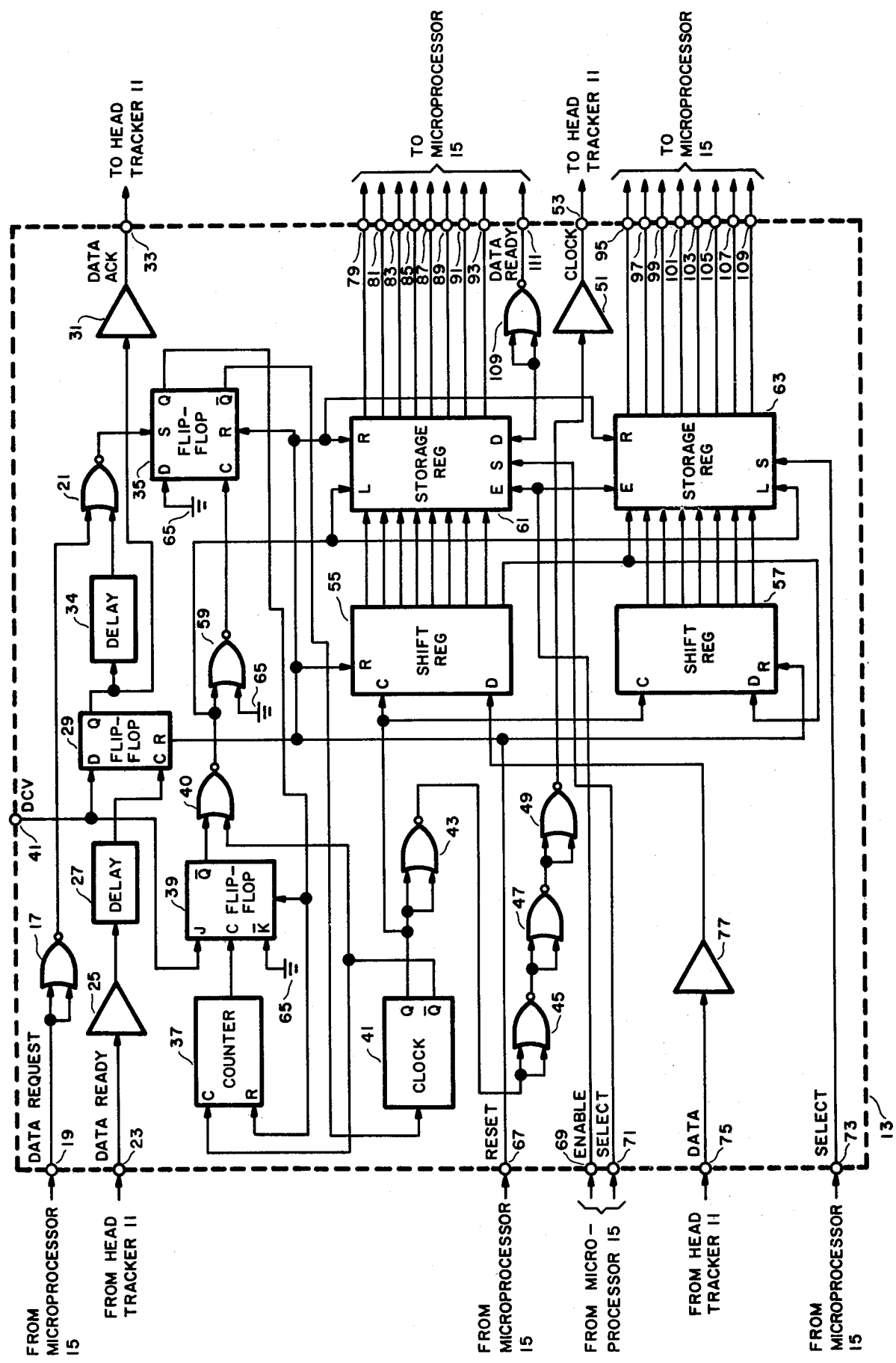
FIG. 2 is an electrical schematic diagram of a serial-to-parallel data conversion interface circuit constituting the subject invention.

Referring now to FIGS. 1 and 2, there is shown in FIG. 2 an electrical schematic diagram of interface circuit 13. Interface circuit 13 includes a NOR gate 17, the inputs of which are connected through an input terminal 19 to the data request output of microprocessor 15. The output of NOR gate 17, in turn, is connected to the first input of a NOR gate 21.

The data ready output of head tracker 11 is connected through an input terminal 23 to the input of a receiver 25, the output of which is connected to the input of a delay circuit 27, with the output thereof connected to the clock input of a flip-flop 29. The Q output of flip-flop 29 is connected to the input of a driver 31, the output of which is connected through an output terminal 33 to the data acknowledge input of head tracker 11. In addition, the Q output of flip-flop 29 is connected to the input of a delay circuit 34, the output of which is connected to the second input of NOR gate 21, with the output thereof connected to the set input of a flip-flop 35.

The Q output of flip-flop 35 is connected to the reset input of a counter 37 and the reset input of a flip-flop 39, the clock input of which is connected to the output of counter 37 and the $\overline{Q}$ output of which is connected to the first input of a NOR gate 40. The output of a direct current voltage source 41 is connected to the data input of flip-flop 29 and the J input of flip-flop 39.

The $\overline{Q}$ output of flip-flop 35 is connected to the input of a clock signal generator 41, the Q output of which is connected to the inputs of a NOR gate 43, with the output thereof connected to the inputs of a NOR gate 45. The output of NOR gate 45 is, in turn, connected to the inputs of a NOR gate 47, the output of which is connected to the inputs of a NOR gate 49, with the output thereof connected to the input of a driver 51. The output of driver 51 is connected through an output terminal 53 to the clock input of head tracker 11. In addition, the Q output of clock 41 is connected to the clock input of a shift register 55 and the clock input of shift register 57.

The Q output of clock 41 is connected to the clock input of counter 37 and the second input of NOR gate 40, the output of which is connected to the first input of a NOR gate 59, with the output thereof connected to the clock input of flip-flop 35. In addition, the output of NOR gate 40 is connected to the latch input of a storage register 61 and the latch input of a storage register 63. A ground 65 is connected to the $\overline{K}$ input of flip-flop 39, the second input of NOR gate 59, and the data input of flip-flop 35.

The reset output of microprocessor 15 is connected through an input terminal 67 to the reset inputs of flip-flop 29, flip-flop 35, shift registers 55 and 57, and storage registers 61 and 63. The enable output of microprocessor 15 is connected through an input terminal 69 to the enable input of storage register 61 and the enable input of storage register 63. The first select output of microprocessor 15 is connected through an input terminal 71 to the select input of storage register 61, while the second select output of microprocessor 15 is connected through an input terminal 73 to the select input of storage register 63.

The data output of microprocessor 15 is connected through an input terminal 75 to the input of a driver 77, the output of which is connected to the data input of shift register 55. Data outputs one through eight of shift register 55 are respectively connected to the data inputs of storage register 61, while the ninth data output thereof is connected to the first data input of shift register 57 and the first data input of storage register 63. The data outputs of shift register 57 are, in turn, connected to the remaining data inputs of storage register 63. The data outputs of storage register 61 are respectively connected through output terminals 79 through 93 to eight of the sixteen data inputs of microprocessor 15, while the data outputs of storage register 63 are respectively connected through output terminals 95 through 109 to the remaining data inputs of microprocessor 15. In addition, the data ready output of a storage register 61 is connected to the inputs of a NOR gate 109, the output of which is connected through an output terminal 111 to the data ready input of microprocessor 15.

In the exemplary serial-to-parallel data conversion interface circuit of FIG. 2, according to the subject invention, components successfully utilized are as follows:

| Component | Component Name | Model No. | Manufacturer |
| --- | --- | --- | --- |
| 17, 21, 40, 43, 45, 47, 49, 59, 109 | NOR Gate | 7402 | Fairchild |
| 27, 34 | Monostable Multivibrator | 9637 | Fairchild |
| 25, 77 | Differential Line Receiver | 9637 | Fairchild |
| 31, 51 | Differential Line Driver | 9638 | Fairchild |
| 29, 35, 39 | Flip-flop | 74S109 | Fairchild |
| 55, 57 | Shift Register | 8273B | Signetics |
| 61, 63 | Eight Bit Latch | 8212 | Intel |

The operation of the subject invention will now be discussed in conjunction with all of the figures of the drawing.

Figure 3:
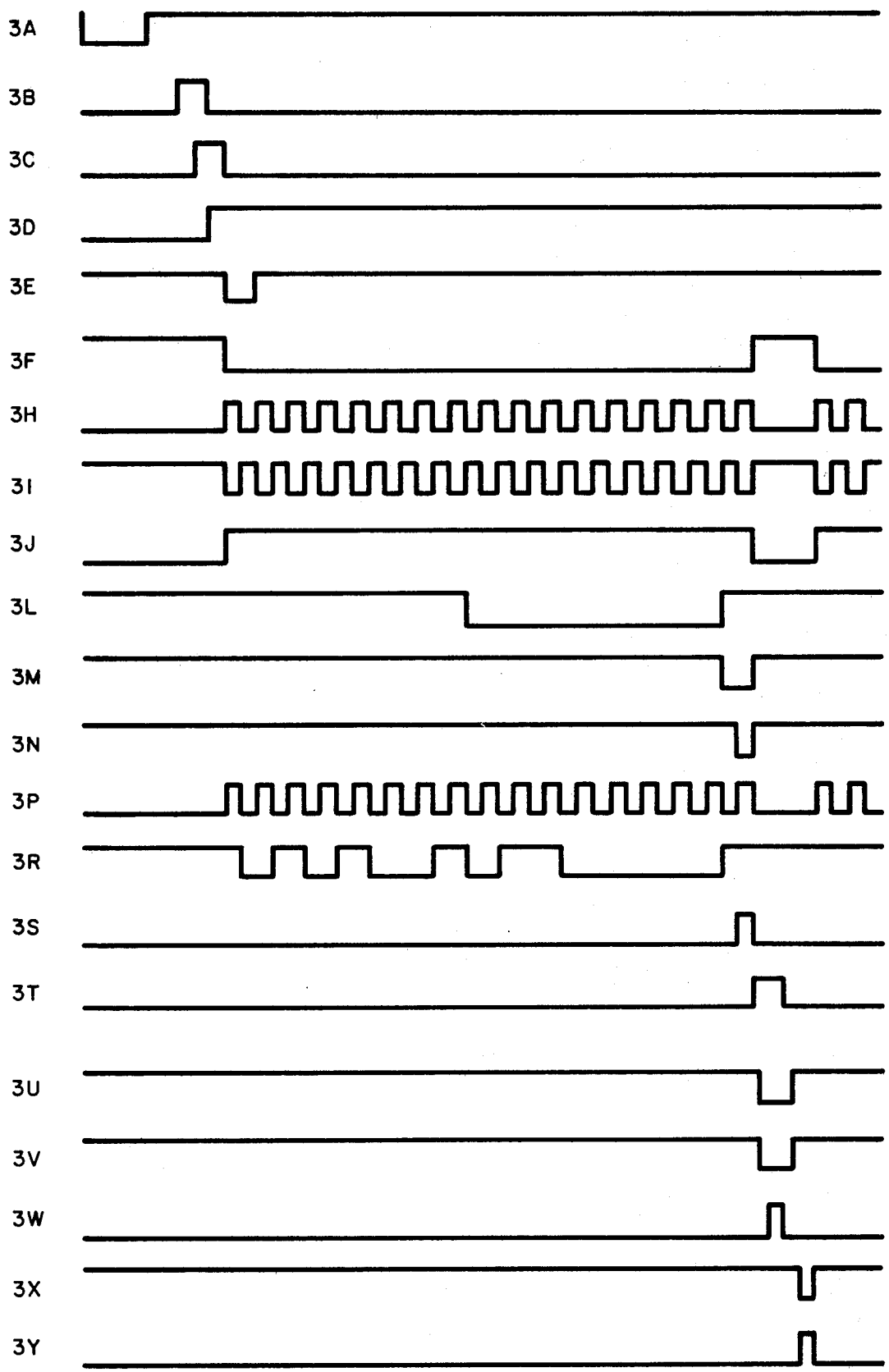
FIG. 3 is an expanded graphical representation of various pulse signals which occur at the outputs of some of the elements of FIG. 2.

Referring to FIGS. 1 and 2, when activated microprocessor 15 initializes interface circuit 13 by supplying to the reset inputs of flip-flops 29 and 35, shift registers 55 and 57, and storage registers 61 and 63, a reset pulse similar to that depicted in the reset pulse signal of FIG. 3A. The reset pulse of the signal 3A, in turn, clears shift registers 55 and 57 such that the outputs thereof are in the logic "0" state, as well as storage registers 61 and 63 such that the data outputs thereof are in the logic "0" state.

In addition, the reset pulse of the signal of FIG. 3A resets flip-flop 29 such that the Q output thereof is in the logic "0" state, and flip-flop 35 such that the Q output thereof is in the logic "0" state, and the $\overline{Q}$ output thereof is in the logic "1" state. The logic "0" provided at the Q output of flip-flop 35 is then supplied to the input of counter 37 so as to reset counter 37 such that the output thereof is in the logic "1" state. In addition, the aforementioned logic "0" resets flip-flop 39 such that the $\overline{Q}$ output thereof is in the logic "1" state.

Referring again to FIGS. 1 and 2, head tracker 11 supplies through receiver 25 to the input of delay circuit 27, a data ready pulse signal similar to that depicted in FIG. 3B. The data ready pulse signal of FIG. 3B, in turn, indicates to interface circuit 13 that head tracker 11 has head movement data stored therein which is ready for processing by micro-processor 15. As will be discussed more fully, the aforementioned head movement data provided by head tracker 11 is indicative of the movement of the head of a trainee or the like in azimuth, roll and elevation.

The data ready pulse signal of FIG. 3B is delayed by delay circuit 27 for approximately 0.5 microseconds such that delay circuit 27 will provide at the output thereof a data ready pulse signal similar to that depicted in FIG. 3C. The signal of FIG. 3C is supplied to the clock input of flip-flop 29 so as to trigger flip-flop 29 such that the Q output thereof will change from the logic "0" state to a logic "1" state, thereby forming at the Q output of flip-flop 29 a data acknowledge pulse signal similar to that depicted in FIG. 3D. The signal of FIG. 3D is, in turn, supplied through driver 31 to head tracker 11 so as to acknowledge receipt by interface circuit 13 of the data ready pulse signal of FIG. 3B supplied thereto by head tracker 11.

In addition, the signal of FIG. 3D is supplied to the input of delay circuit 34 such that the output thereof will change from a logic "0" state to a logic "1" state approximately 0.5 microseconds after the application of the positive going edge of the signal of FIG. 3D to the input of delay circuit 34. The logic "1" provided by delay circuit 34 is then supplied to NOR gate 21 such that the output thereof will change from a logic "1" state to a logic "0" state, as shown in the signal waveform of FIG. 3E. This, in turn, will cause $\overline{Q}$ output of flip-flop 35 to change from the logic "1" state to a logic "0" state, as shown in the signal waveform of FIG. 3F, thereby activating clock 41. Clock 41, in turn, will provide at the Q output thereof a clock signal similar to that depicted in FIG. 3H, and at the $\overline{Q}$ output thereof a clock signal similar to that depicted in FIG. 3I.

In addition, when a logic "0" is supplied to the set input of flip-flop 35, the Q output thereof changes from a logic "0" state to a logic "1" state, as shown in the signal waveform of FIG. 3J, so as to activate counter 37 and flip-flop 39.

The clock signal of FIG. 3I is supplied to the clock input of counter 37, which is preset to count to sixteen. After the application of the positive going edge of the eighth clock pulse of the clock signal of FIG. 3I to the clock input of counter 37, the output thereof will change from a logic "1" state to a logic "0" state, as represented by the signal waveform of FIG. 3L. Similarly, after the application of the positive going edge of the sixteenth clock pulse of the clock signal of FIG. 3I to the clock input of counter 37, the output thereof will change from a logic "0" state to a logic "1" state, as shown in the signal waveform of FIG. 3L.

Application of the positive going edge of the signal of FIG. 3L triggers flip-flop 39 such that the $\overline{Q}$ output thereof will change from a logic "1" state to a logic "0" state, as shown in the signal waveform of FIG. 3M. This, in turn, opens NOR gate 40 such that the seventeenth pulse of the signal of FIG. 3I will pass through NOR gates 40 and 59, as shown in the signal waveform of FIG. 3N. The pulse of the signal of FIG. 3N is then supplied to the clock input of flip-flop 35 so as to trigger flip-flop 35 such that the Q output thereof will change from a logic "1" state to a logic "0" state as shown in the signal of FIG. 3J. This, in turn, inhibits counter 37, and resets flip-flop 39 such that the $\overline{Q}$ output thereof will change from the logic "0" state to a logic "1" state as depicted in the signal of FIG. 3M.

As discussed previously, activation of clock 41 will cause clock 41 to provide at the Q output thereof the clock signal of FIG. 3H. The clock signal of FIG. 3H, in turn, passes through NOR gates 43, 45, 47, and 49, which delay the aforementioned signal approximately 15 nanoseconds, as depicted in the signal waveform of FIG. 3P. The clock signal of FIG. 3P is then supplied through driver 51 to the clock input of head tracker 11 so as to effect the transfer of the data bits stored within head tracker 11 from head tracker 11 to interface circuit 13.

Head tracker 11 has stored therein three data words, the first of which indicates azimuthal movement of the head of the wearer of head tracker 11, the second of which indicates elevational movement of the head of the wearer of head tracker 11, and the third of which indicates roll movement of the head of the wearer of head tracker 11. Each data word stored within head tracker 11, in turn, has sixteen data bits, and a parity bit as depicted in the signal waveform of FIG. 3R, with the particular data word depicted in FIG. 3R having a data bit pattern of 1010100101100000 and a parity bit of 1.

The first bit of the data word of FIG. 3R is supplied through receiver 77 to the data input of shift register 55. Head tracker 11 then supplies to interface circuit 13 the data ready pulse signal of FIG. 3A so as to activate clock 41, in the manner described above, such that clock 41 will provide at the Q output thereof the clock signal of FIG. 3H. The aforementioned clock signal of FIG. 3H is, in turn, supplied to the clock input of shift register 55, with the negative going edge of the first clock pulse thereof clocking into shift register 55 the first data bit of the data word of FIG. 3R.

The negative going edge of the first clock pulse of the clock signal of FIG. 3P then transfers the second data bit of the data word of FIG. 3R to the clock input of shift register 55, so as to allow the negative going edge of the second clock pulse of the clock signal of FIG. 3H to clock the aforesaid data bit into shift register 55. The above pattern is repeated until each data bit and the parity bit of the data word of FIG. 3R are clocked serially into shift registers 55 and 57.

At this time it should be noted that the sixteen data bits of the data word of FIG. 3R appear at the data outputs of shift registers 55 and 57. However, the parity bit of the data word of FIG. 3R is stored within shift register 55, since the aforementioned parity bit is an error bit, the processing of which is not necessary by microprocessor 15.

Ad discussed above, when the $\overline{Q}$ output of flip-flop 39 changes from a logic "1" state to a logic "0" state such that NOR gate 40 is opened, the seventeenth pulse of the clock signal of FIG. 3I will pass through NOR gate 40. In addition, NOR gate 40 inverts the aforementioned pulse, as depicted in the signal waveform of FIG. 3S.

The pulse of the signal of FIG. 3S is then supplied to the latch inputs of storage registers 61 and 63 such that the storage registers 61 and 63 will latch therein on the negative going edge of the aforesaid pulse the sixteen bit data word appearing at the data outputs of shift registers 55 and 57.

Storage register 61 then provides at the data ready output thereof a data ready pulse signal similar to that depicted in FIG. 3T. The data ready pulse signal of FIG. 3T is, in turn, passed through NOR gate 109, which inverts the aforesaid data ready pulse signal and then supplies the resultant signal to the data ready input of microprocessor 15. Microprocessor 15, in response to the data ready pulse signal of FIG. 3T, provides first and second decoded address select signals, respectively depicted in FIG. 3U and FIG. 3V. The decoded address select signal of FIG. 3U is then supplied to the select input of storage register 61 so as to address storage register 61 and thereby activate storage register 61, while the decoded address select signal of FIG. 3V is supplied to the select input of storage register 63 so as to address storage register 63, and thereby activate storage register 63. In addition, in response to the data ready pulse signal of FIG. 3T, microprocessor 15 supplies to the enable inputs of storage registers 61 and 63 an enable signal similar to that of FIG. 3W. The aforesaid enable signal of FIG. 3W, in turn, causes the transfer of the sixteen bit data word stored within registers 61 and 63 to microprocessor 15 for processing thereby.

Microprocessor 15 then provides at the data request output thereof a data request pulse signal similar to that depicted in FIG. 3X. The data request pulse signal of FIG. 3X, in turn, indicates to interface circuit 13 that microprocessor 15 is ready for the transfer of a second data word from head tracker 11. The data request pulse signal of FIG. 3X is inverted by NOR gate 21, as shown in the signal waveform of FIG. 3Y and then supplied to the set input of flip-flop 35 so as to trigger flip-flop 35.

This, in turn, activates clock 41 such that clock 41 will provide at the Q and $\overline{Q}$ outputs thereof, respectively, the clock signals of FIGS. 3H and 3I. The clock signals of FIGS. 3H and 3I will then effect the transfer of the second data word from head tracker 11 to microprocessor 15 in the manner described previously.

As mentioned above, head tracker 11 provides at the data output thereof three data words indicative respectively of azimuthal, elevational, and roll movement of the head of the wear of head tracker 11. The third data word provided by head tracker 11 is, in turn, transferred from head tracker 11 through interface circuit 13 to microprocessor 15 in the manner described above.

When the aforementioned three data words have been transferred to microprocessor 15 for processing thereby, microprocessor 15 will provide at the reset output thereof the reset pulse signal of FIG. 3A so as to reset interface circuit 13. This, in turn, allows for the transfer of three additional data words from head tracker 11 through interface circuit 13 to microprocessor 15 in the manner described above.

From the foregoing, it may readily be seen that the subject invention comprises a new, unique, and exceedingly useful serial to parallel data conversion interface circuit which constitutes a considerable improvement over the known prior art. Obviously, many modifications and variations of the present invention are possible in light of the above teachings. It is, therefore, to be understood that within the scope of the appended claims the invention may be practiced otherwise than as specifically described.

What is claimed is:

1. A serial to parallel data conversion circuit comprising, in combination:
   a first input terminal adapted to receive a data ready pulse signal;
   a second input terminal adapted to receive a data request pulse signal;
   a third input terminal adapted to receive a plurality of data words, each of which has a predetermined number of data bits;
   clock generating means having an input, and first and second outputs, for providing at the first output thereof a clock signal and at the second output thereof an inverted clock signal, each of which has a series of uniformly spaced clock pulses;
   shift register means having a clock input connected to the first output of said clock generating means, a data input connected to said third input terminal, and a plurality of outputs, adapted for receiving and storing therein, in response to each clock pulse of said clock signal, one bit of each of said plurality of data words;
   gating means having a first input connected to said first input terminal, a second input connected to said second input terminal, a third input connected to the second output of said clock generating means, a first output connected to the input of said clock generating means, a second output, and a third output, for providing in response to said data ready pulse signal, a data acknowledge pulse signal, for providing a latch pulse signal, and for activating for a predetermined time period, in response to said inverted clock signal, said clock generating means so as to effect the storage of each of said plurality of data words within said shift register means, with the first of said data words being stored within said shift register means in response to said data ready pulse signal, and with each successive data word being stored within said shift register means in response to said data request pulse signal;
   a fourth input terminal adatped to receive an enable pulse signal;
   storage means having a plurality of data inputs respectively connected to the outputs of said shift register means, a latch input connected to the second output of said gating means, an enable input connected to said fourth input terminal, a data ready output, and a plurality of data outputs adapted for latching therein, in response to said latch pulse signal, each data word stored within said shift register means, and for transferring to the outputs thereof, in response to said enable pulse signal, the data words stored therein.

2. The serial to parallel data conversion circuit of claim 1, wherein each data word has therein sixteen data bits.

3. The conversion circuit of claim 1, wherein said shift register means comprises:
   a first shift register having a clock input connected to the first output of said clock generating means, a data input connected to said third input terminal, and a data output;
   a second shift register having a clock input connected to the first output of said clock generating means, and a data input connected to the data output of said first shift register; and
   a receiver connected between said third input terminal and the data input of said shift register.

4. The conversion circuit of claim 1, wherein said gating means comprises:
   a first receiver having an input connected to said first input terminal and an output;
   a first delay circuit having an input and an output, with the input thereof connected to the output of said first receiver;
   a first flip-flop having a clock input, a data input, a reset input, and a Q data output, with the clock input thereof connected to the output of said first delay circuit;
   a second delay circuit having an input and an output, with the input thereof connected to the Q output of said first flip-flop;
   a direct current voltage source having an output connected to the data input of said first flip-flop;
   a first NOR gate having first and second inputs connected to said second input terminal, and an output;
   a second NOR gate having first and second inputs, and an output with the first input thereof connected to the output of said first NOR gate, and the second input thereof connected to the output of said second delay circuit;
   a ground;
   a second flip-flop having a data input, a set input, a clock input, a reset input, a Q output, and a $\overline{Q}$ output, with the data input thereof connected to said ground, with the set input thereof connected to the output of said second NOR gate, and with the $\overline{Q}$ output thereof connected to the input of said clock generating means;
   a driver having an input connected to the Q output of said first flip-flop;
   a counter having a clock input, a reset input, and an output, with the clock input thereof connected to the second output of said clock generating means, and with the reset input thereof connected to the Q output of said second flip-flop;

a third flip-flop having a clock input, a J input, a K input, a reset input, and a $\overline{Q}$ output, with the clock input thereof connected to the output of said counter, the J input thereof connected to the output of said direct current voltage source, and with the reset input thereof connected to the Q output of said second flipflop;

a third NOR gate, having first and second inputs and an output, with the first input thereof connected to the $\overline{Q}$ output of said third flip-flop, with the second input thereof connected to the second output of said clock generating means, and with the output thereof connected to the latch input of said storage means; and a fourth NOR gate having first and second inputs and an output, with the first input thereof connected to the output of said third NOR gate, with the second input thereof connected to said ground, and with the output thereof connected to the clock input of said second flip-flop.

5. The conversion circuit of claim 1, wherein said storage means comprises:

a first storage register having a latch input connected to the second output of said gating means, eight data inputs respectively connected to eight of the plurality of outputs of said shift register means, an enable input connected to said fourth input terminal, and a data ready output;

a second storage register having a latch input connected to the second output of said gating means, eight data inputs respectively connected to the remaining outputs of said shift register means, and an enable input connected to said fourth input terminal; and a NOR gate having a pair of inputs connected to the data ready output of said first storage register.

6. The conversion circuit of claim 1, further characterized by:

a delay circuit having an input connected to the first output of said clock generating means, and an output;

a driver having an input connected to the output of said delay circuit and an output;

a head tracker having a clock input connected to the output of said driver, a data acknowledge input connected to the third output of said gating means, a data ready output connected to said first input terminal, and a data output connected to said third input terminal.

7. The conversion circuit of claim 1, further characterized by a microprocessor computer having a plurality of data inputs effectively and respectively connected to the data outputs of said storage means, a data ready input connected to the data ready output of said storage means, a data request output connected to said second input terminal, and an enable output connected to said fourth input terminal.

8. An interface circuit comprising, in combination:
a first receiver having an input and an output;
a first delay circuit having an input and an output, with the input thereof connected to the output of said first receiver;
a first flip-flop having a clock input, a data input, a reset input, and a Q output with the clock input thereof connected to the output of said first delay circuit;

a direct current voltage source having an output connected to the data input of said first flip-flop;

a second delay circuit having an input and an output, with the input thereof connected to the Q output of said first flip-flop;

a first NOR gate having first and second inputs and an output;

a second NOR gate having first and second inputs, and an output, with the first input thereof connected to the output of said first NOR gate, and the second input thereof connected to the output of said second delay circuit;

a ground;

a second flip-flop having a data input, a set input, a reset input, a clock input, a Q output, and a $\overline{Q}$ output, with the data input thereof connected to said ground, and with the set input thereof connected to the output of said second delay circuit;

a driver having an input and an output, with the input thereof connected to the Q output of said first flip-flop;

a clock signal generator having an input, a Q output, and a $\overline{Q}$ output, with the input thereof connected to the $\overline{Q}$ output of said second flip-flop;

a counter having a clock input, a reset input, and an output, with the clock input thereof connected to the $\overline{Q}$ output of said clock, and with the reset input thereof connected to the Q output of said second flip-flop;

a third flip-flop having a clock input, a J input, a K input, a reset input, and a $\overline{Q}$ output, with the clock input thereof connected to the output of said counter, with the J input thereof connected to the output of said direct current voltage source, with the $\overline{K}$ input thereof connected to said ground, and with the reset input thereof connected to the Q output of said second flip-flop;

a third NOR gate having first and second inputs and an output, with the first input thereof connected to the $\overline{Q}$ output of said third flip-flop and with the second input thereof connected to the $\overline{Q}$ output of said clock signal generator;

a fourth NOR gate having first and second inputs and an output, with the first input thereof connected to the output of said third NOR gate, with the second input thereof connected to said ground, and with the output thereof connected to the clock input of said second flip-flop;

a third delay circuit having an input and an output with the input thereof connected to the Q output of said clock signal generator;

a second driver having an input and an output, with the input thereof connected to the output of said third delay circuit;

a second receiver having an input and an output;

a first shift register having a clock input, a reset input, a data input, and nine outputs, with the clock input thereof connected to the Q output of said clock signal generator, and with the data input thereof connected to the output of said second receiver;

a second shift register having a clock input, a reset input, a data input, and seven outputs, with the clock input thereof connected to the Q output of clock signal generator, and with the data input thereof connected to the ninth output of said first shift register;

a first storage register having an enable input, a select input, a reset input, a latch input, eight data inputs, a data ready output, and eight data outputs, with the latch input thereof connected to the output of said third NOR gate, and with the data inputs thereof respectively connected to eight of the nine outputs of said first shift register;

a second storage register having an enable input, a select input, a reset input, a latch input, eight data inputs, and eight data outputs, with the latch input thereof connected to the output of said third NOR gate, with the first data input thereof connected to the ninth data output of said shift register, and with the remaining data inputs thereof respectively connected to the outputs of said second shift register; and a fifth NOR gate having an input and an output, with the input thereof connected to the data ready output of said first storage register.

9. The interface circuit of claim 8, wherein said first and second delay circuits each comprise a monostable multivibrator.

10. The interface circuit of claim 8, wherein said third delay circuit comprises:

a first NOR gate having a pair of inputs and an output with the pair of inputs thereof connected to the Q output of said clock;

a second NOR gate having a pair of inputs and an output, with the pair of inputs thereof connected to the output of said first NOR gate;

a third NOR gate having a pair of inputs and an output, with the pair of inputs thereof connected to the output of said second NOR gate; and a fourth NOR gate having a pair of inputs and an output, with the pair of inputs thereof connected to the output of said third NOR gate.

11. The interface circuit of claim 8, wherein each of said storage registers comprises an eight-bit latch.

12. The interface circuit of claim 8, further characterized by a head tracker having a data acknowledge input connected to the output of said first driver, a clock input connected to the output of said second driver, a data ready output connected to the input of said first receiver, and a data output connected to the input of said second receiver.

13. The interface circuit of claim 8, further characterized by a microprocessor computer having sixteen data inputs, eight data inputs of which are effectively and respectively connected to the data outputs of said first storage register, and the remaining data inputs of which are effectively and respectively connected to the data output of said second storage register, a data ready input connected to the output of said fifth NOR gate, a reset output connected to the reset inputs of said first and second flip-flops, said first and second shift registers, and said first and second storage registers, an enable output connected to the enable inputs of said first and second storage registers, first and second select outputs respectively connected to the select inputs of said first and second storage registers, and a data request output connected to the first and second inputs of said first NOR gate.

* * * * *